United States Patent
Ma et al.

(10) Patent No.: US 8,953,670 B1
(45) Date of Patent: Feb. 10, 2015

(54) DIGITAL POWER ENCODER FOR DIRECT DIGITAL-RF TRANSMITTER

(71) Applicant: Mitsubishi Electric Research Laboratories, Inc., Cambridge, MA (US)

(72) Inventors: Rui Ma, Somerville, MA (US); Qiuyao Zhu, Chicago, IL (US); Koon Hoo Teo, Lexington, MA (US); Chunjie Duan, Brookline, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 0 days.

(21) Appl. No.: 14/063,518

(22) Filed: Oct. 25, 2013

(51) Int. Cl.
| | |
|---|---|
| *H03K 7/08* | (2006.01) |
| *H03K 9/08* | (2006.01) |
| *H04B 1/04* | (2006.01) |
| *H04L 25/49* | (2006.01) |

(52) U.S. Cl.
CPC .......... *H04B 1/0475* (2013.01); *H04L 25/4902* (2013.01); *H04B 2001/0425* (2013.01); *H04B 2001/045* (2013.01)

USPC .............................................. 375/238; 327/31

(58) Field of Classification Search
USPC ........................................................ 375/238
See application file for complete search history.

(56) References Cited

U.S. PATENT DOCUMENTS

| | | | |
|---|---|---|---|
| 6,297,696 B1* | 10/2001 | Abdollahian et al. ..... 330/124 R |
| 2004/0156640 A1* | 8/2004 | Dress et al. ................... 398/140 |
| 2006/0067423 A1* | 3/2006 | May et al. ..................... 375/295 |
| 2007/0041480 A1* | 2/2007 | Azakami et al. .............. 375/345 |
| 2010/0003029 A1* | 1/2010 | Dress et al. ...................... 398/66 |
| 2010/0106041 A1* | 4/2010 | Ghovanloo et al. ........... 600/544 |
| 2014/0132363 A1* | 5/2014 | Singerl et al. ................. 332/109 |

* cited by examiner

*Primary Examiner* — Erin File
(74) *Attorney, Agent, or Firm* — Dirk Brinkman; Gene Vinokur

(57) ABSTRACT

A transmitter includes a first digital up-converter for converting data to an intermediate frequency (IF) signal, a pulse width modulator (PWM) for encoding the IF signal to an IF pulse train, a second digital up-converter for converting the IF pulse train to a radio frequency (RF) pulse train, a power amplifier for amplifying the RF pulse train; and a filter for reconstructing a RF analog signal from the amplified RF pulse train.

10 Claims, 9 Drawing Sheets

DIGITAL POWER ENCODER FOR DIRECT DIGITAL-RF TRANSMITTER

RELATED APPLICATION

This application is related to co-pending U.S. patent application Ser. No. 14/063,543 MERL-2685 entitled "System and method for linearizing power amplifiers," filed by Ma et al. and incorporated herein by reference.

FIELD OF THE INVENTION

The present invention relates generally to power coding schemes for power amplifiers, and more particularly to a digital pulse-width-modulation encoder for radio frequency (RF) switch mode power amplifiers in direct digital-RF transmitters.

BACKGROUND OF THE INVENTION

A direct digital-RF transmitter (TX) has several advantages compared to digital-analog-RF transmitters. The direct digital-RF transmitter arranges the digital-analog interface close to the antenna so that fewer analog components are required. The typical analog issues like in-phase and quadrature-phase (IQ) mismatch, local oscillator (LO) leakage; image distortion can be largely alleviated and even avoided. The direct digital-RF transmitter also enhances the system flexibility through multi-mode and multi-band operation enabled by agile digital signal processing. In addition, the direct digital-RF transmitter can take advantage of the increasing speed and density of digital processing, and high level integration. Thus, the direct digital-RF transmitters have benefits for both base-station and mobile applications.

The direct digital-RF transmitter includes a switching mode power amplifier (SMPA), such as a class-D or class-S power amplifier, employing a particular power coding scheme, such as DSM (delta sigma modulation), PWM (pulse width modulation) and PPM (pulse position modulation), in addition with a reconstruction band-pass filter (BPF).

In terms of power, the RF power amplifier (PA) consumes the most energy in the transmitter. A main advantage of this transmitter is that, the SMPA is always between ON (saturated) and OFF (cut-off) operating regions, achieving high peak efficiency. However, if non-constant envelope signals, which are common for $3^{rd}$ generation (3G) and $4^{th}$ generation (4G) cellular mobile communication systems, are encoded into the single bit digitized signals, then the in-band power over the entire digitized signal power, defined as the power coding efficiency, is low, because the generation of quantization noise is inevitable and widely spread throughout the frequency domain due to a noise shaping function, which is required from the system linearity specification. Because this noise signal is also amplified by the SMPA, the unwanted noise power becomes wasteful, which causes both excessive power loss and total TX efficiency degeneration.

This problem is present in the band-pass delta-sigma modulation (BPDSM) based class-S power amplifiers. See, e.g., U.S. 2003/0210746, U.S. 2006/0188027, EP 2063536, and U.S. Pat No. 7,825,724.

The total TX power efficiency is related to the power coding efficiency of the encoder as well as the power efficiency of the PA. The PA efficiency $\eta_{PA}$, which depends on the PA circuit design, is usually relatively high (>80%) for SMPA at saturated power level. In contrast, the power coding efficiency $\eta_{CODE}$ is the direct measurement of the power spectral density (PSD) of the encoder pulse train p(t) and is based on the performance of the encoder. The performance of the encoder is relatively low (<20%) for conventional power coding schemes with non-constant envelope modulated signals. Therefore, the power coding efficiency $\eta_{CODE}$ is the primary concern for direct digital-RF transmitter, which sets the upper bound of the entire efficiency of the transmitter. To increase the efficiency of direct digital-RF transmitters under modulated non-periodic switching conditions, the power coding efficiency needs to be improved.

The low power coding efficiency is a result of noise shaping in a delta sigma power coding scheme. Thus, some conventional coding schemes use various PWM techniques to improve the power coding efficiency.

For example, Blocher et al., "Coding efficiency for different switched-mode RF transmitter architectures," *Circuits and Systems, 2009. MWSCAS'09. 52nd IEEE International Midwest Symposium on*, vol., no., pp. 276,279, 2-5 Aug. 2009, describe a polar PWM architecture. The envelope of the baseband signal is modulated in a PWM encoder, where the PWM encoding is performed by comparing the envelope magnitude with a reference waveform (triangular or sawtooth). Typically, the frequency of the PWM reference waveforms is 10-100 times the baseband bandwidth of the input signal. This architecture can achieve high power coding efficiency and required linearity, but is hard to implement digitally. In addition, since the transmitted signal is combined directly at the RF carrier frequency, the time alignment between amplitude and phase is difficult, especially for wideband signals.

Another power coding efficiency enhancement approach is RFPWM, described in Raab, F. H., "Class-D power amplifier with RE pulse-width modulation, *Microwave Symposium Digest (MTT), 2010 IEEE MTT-S International*, vol., no., pp. 924,927, 23-28 May 2010. The output signal of RFPWM includes 2-level (unipolar or bipolar-NRZ) or 3-level waveform (bipolar-RZ) per RF carrier period. First, both baseband in-phase (I) and quadrature (Q) are up-converted into RF domain. The magnitudes of RF Cartesian signals are encoded by the varied pulse width to generate pulse width modulated RF signal. By this method, any complex input signal can be mapped to a time-continuous and amplitude-discrete output signal suited for switch-mode amplification. However, this encoding is also processed by analog/RF high speed comparators, which is usually cost and energy hungry. Therefore, the RFPWM encoder is suitable to the low carrier frequency like the class-D power amplifiers for audio applications, but not fit for RF transmitter applications at GHz.

Other PWM power coding schemes for digital implementation include pulse-position modulation (PPM), e.g., PWM/PPM scheme described in U.S. Pat. No. 6,993,087 and pulse width position modulation (PWPM) described in Thiel, B. T.; Dietrich, S.; Zimmermann, N.; Negra, R., "System architecture of an all-digital GHz transmitter using pulse-width/position-modulation for switching-mode PAs," *Microwave Conference, 2009. APMC 2009. Asia Pacific*, vol., no., pp. 2340,2343 7-10 Dec. 2009. Similar to the polar PWM, in PWM/PPM, the envelope magnitude is encoded in the pulse width and the phase information is mapped to the position of the pulse, which is encoded by PPM. The difference is that, to fit the limited sampling rate of digital system, e.g., a few times the RF carrier frequency, and to meet the requirement of linearity, both envelope magnitude and phase signals should be noise-shaped first by band-pass delta sigma function, and then processed by the PWM/PPM. But the noise-shaping degrades the power coding efficiency dramatically.

Hence, there is a demand for a high-efficiency new power coding scheme, particularly the capability of digital implementation for the direct digital-RF transmitter architecture.

SUMMARY OF THE INVENTION

One objective of some embodiments of the invention is to improve the power coding efficiency with required linearity for the direct digital-RF (radio frequency) transmitter, especially for wide bandwidth high peak-to-average power ratio (PAPR) mobile communication signals. It is a further objective of some embodiments to provide an all-digital implementation for the direct digital-RF transmitter, which may include class-S power amplifier.

Some embodiments are based on recognition that RF pulse-width modulation (RFPWM) has a high power coding efficiency. But for a digital implementation, the RFPWM requires an extremely high sampling clock rate ($50 \times f_{RF}$) to sample the RF Cartesian IQ signals to preserve the signal linearity, especially for suppressing the in-band noise floor and out-of-band image replicas. With the restricted sampling rate by FPGA or other digital processors and maximum RF SMPA switching speed, this is not feasible.

Several embodiments of the invention are based on a realization that by decreasing the PWM input carrier to an intermediate frequency (IF), and then encoding the IF signals by a pulse-width-modulator, the time domain quantization is extended and magnitude of the quantization increased. Thus, the accessible clock rate of current digital processors can implement this power coding algorithm and the direct digital output to switch-mode power amplifiers (SMPA) becomes realizable.

One embodiment uses the multi-level encoder based on a non-uniform multi-level quantizer with multiple fixed thresholds. The thresholds can be determined by a probability density function (PDF) of a portion, e.g., a frame of the input signal. In one embodiment, a pre-distortion block based on look-up table (LUT) is added before the encoder to further compensate the non-linearity of the PWM encoder. And after the encoder, a 4-phase local oscillator (LO) is employed to up-convert the IF IQ signal into RF band. Hence, this embodiment is a two-stage digital up-conversion at a reduced sampling rate. Because this is a pipeline architecture, a parallel implementation can increase the sampling rate for higher time domain quantization to achieve the desired linearity.

In addition, this architecture can be extended to multi-mode and multi-band operation. Multiple baseband inputs can be processed separately, and then combined by a parallel-to-serial combiner.

Accordingly, one embodiment discloses a transmitter, including a first digital up-converter for converting data to an intermediate frequency (IF) signal; a pulse width modulator (PWM) for encoding the IF signal to an IF pulse train; a second digital up-converter for converting the IF pulse train to a radio frequency (RF) pulse train; a power amplifier for amplifying the RF pulse train; and a filter for reconstructing a RF analog signal from the amplified RF pulse train.

Another embodiment discloses a power encoder for digital-RF transmitter. The power encoder includes a first digital up-converter for converting data to intermediate frequency (IF) signal; a pulse width modulator (PWM) for encoding the IF signal to an IF pulse train; and a second digital up-converter for converting the IF pulse train to a radio frequency (RF) pulse train.

Yet another embodiment discloses a method for transmitting data. The method includes converting data into an intermediate frequency (IF) signal; encoding the IF signal to an IF pulse train using a pulse width modulation; and converting the IF pulse train to a radio frequency (RF) pulse train.

DETAILED DESCRIPTION OF THE PREFERRED EMBODIMENTS

Advanced switch-mode power amplifiers (SMPAs), e.g. class-S, are now common. The benefits of high theoretical power efficiency and operational flexibility manifest themselves as very promising enablers for the next generation direct digital-RF transmitter (TX) in a software-defined radio (SDR).

The direct digital-RF transmitter uses a class-S amplifier as the final amplification stage to amplify a high frequency pulse-train generated by a power encoder, like delta sigma modulator (DSM), pulse width modulator (PWM), or pulse position modulator (PPM). Normally, a high-quality(Q) (>500) bandpass filter (BPF) is needed to reconstruct the signal back to analog RF. Notably, with the recent advancement of gallium nitride (GaN) RF transistor technology, this architecture is gaining more attention, in particular for pico-/macro-base station applications.

However, the very low "power coding efficiency" (defined here specifically as a ratio of the desired in-band power to the entire band power of the digitized signal, to clearly distinguish from the power coding efficiency mentioned normally in information theory) of the conventional power encoders handling communication signals with high peak-to-average-ratio (PAR>8 dB) is one of the most critical factors affecting the power efficiency of the TX, as the SMPA amplifies large portion of useless out-of-band noise. So far, the most widely adopted power encoder (e.g. DSM) achieves in practice only limited power coding efficiency (<30%). This is attributed to the generation of quantization noise and the noise shaping function for enhancing the in-band SNR. The embodiments of this invention provide a high power coding efficiency digital power encoder for direct digital-RF transmitters.

To meet the spectrum linearity requirement, especially for suppressing the in-band noise floor and out-of-band image replicas, the power encoder needs an ultra-fast sampling clock ($50 \times f_{RF}$) to obtain sufficient over-sampling ratio of RF at GHz frequencies for cellular applications, which is hard to implement using conventional digital processors.

Some embodiments of the invention use intermediate frequency PWM (IFPWM) via two-stage digital up-conversion at a greatly reduced sampling rate while also achieving high power coding efficiency. To leverage the advantages of RFPWM and overcome the hardware implementation challenges described above, the IFPWM is consequently realized by decreasing the PWM input frequency to an intermediate frequency (IF) e.g. 100 MHz, and then perform the encoding with Cartesian IF IQ signals.

Figure 1:
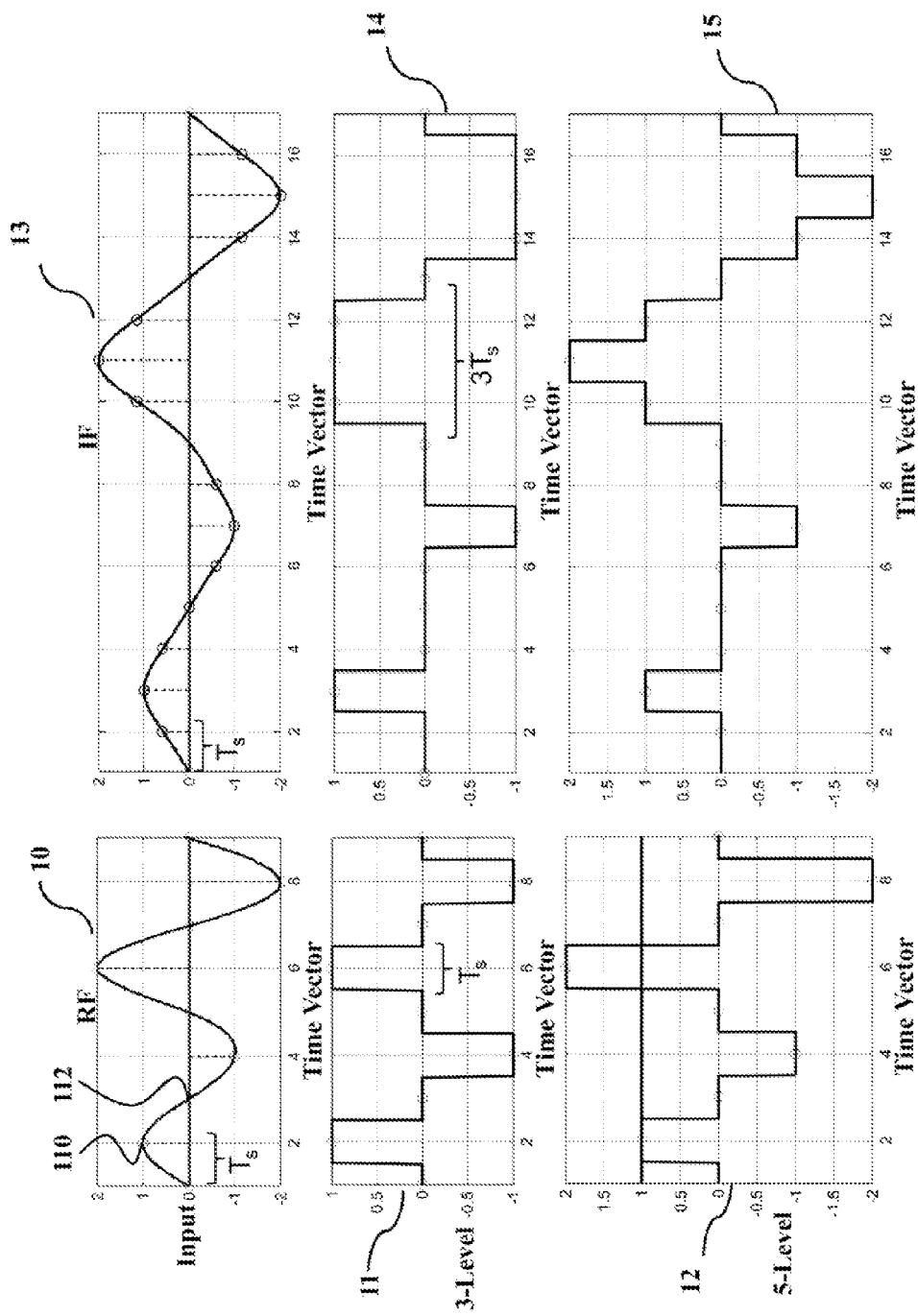
FIG. 1 is a graph of the comparison between radio frequency and intermediate frequency power-width modulations.

FIG. 1 includes graphs of a comparison of 3-/5-Level RFPWM and 3-/5-Level IFPWM, at $V_{th1}=0.8$ $V_{th2}=1.6$. The graphs demonstrate the quantization effects of different carrier frequencies and amplitude levels at a fixed sampling clock rate $1/T_s$. Each sample point is marked as a small circle, e.g., 110, and 112, in the waveform curves. The two input signals, i.e., signal 10 with RF frequency and signal 13 with IF frequency are compared. The RF signal 10 has twice carrier frequency $f_c$ than the IF signal 13. Assume the first threshold reference level $V_{th1}$ is 0.8 and the second $V_{th2}$ is 1.6, the outputs of processing the signal 10 have 3-level 11 and 5-level 12 amplitude quantization. The outputs of processing the signal 13 have 3-level 14 and 5-level 15 amplitude quantization. The plot 14 has double the amount of information than the plot 11, in terms of sampling point, so as the plot 15 in comparison with the plot 12. Comparing to the plot 11, plot 14 has the pulse-width variation of three continuous sample periods to reflect the second large amplitude period of the input signal in plot 10 and the plot 13. Moreover, comparing plot 12 to the plot 11, the plot 15 compared to the plot 14, 5-level has more detailed information than 3-level, and the plot 12 and the plot 15 are closer to the original analog signal before sampled. Therefore, the plot 15 is the preferred sampling and quantization scheme by one embodiment of the invention. FIG. 1 illustrates that the multi-level ML-IFPWM has the advantage over ML-RFPWM, given the limited sampling clock rate of conventional digital processors.

Figure 2A:
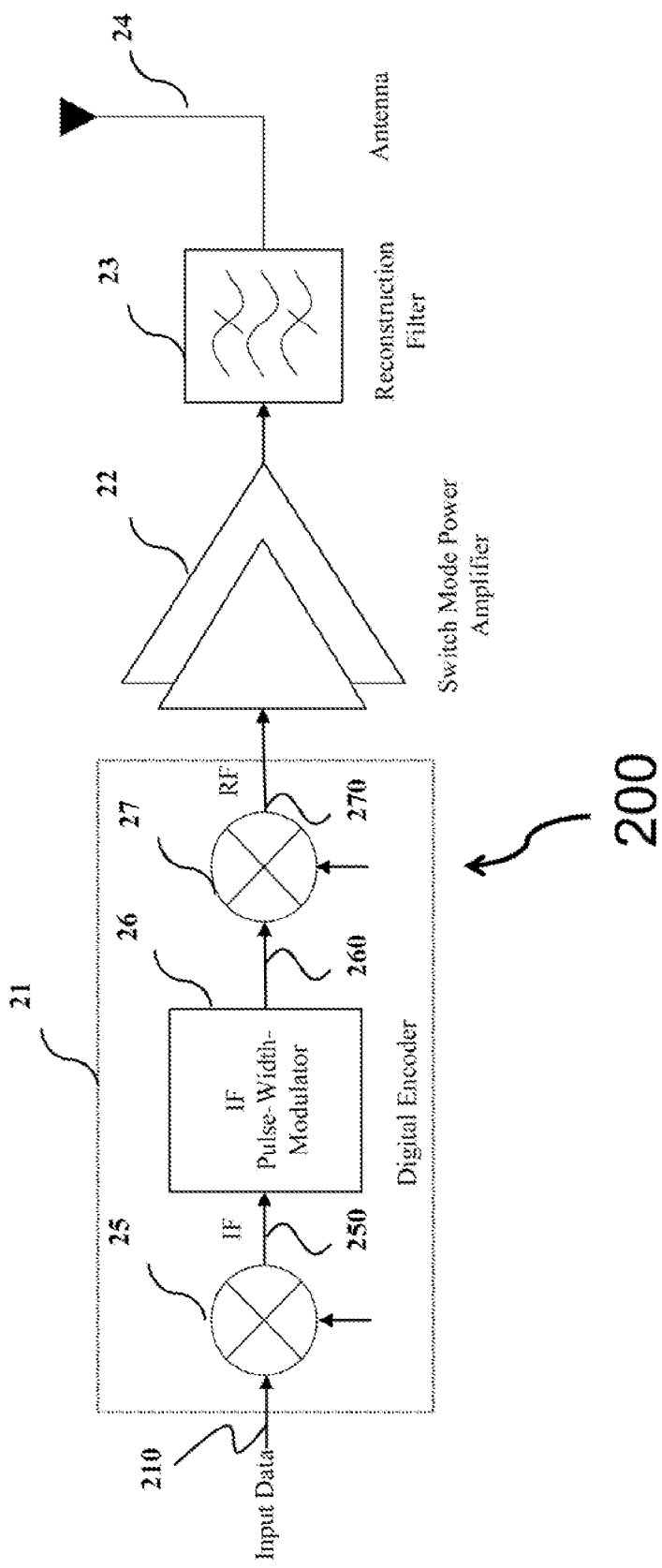
FIG. 2A is a block diagram of the direct digital-RF transmitter according to some embodiments of the invention.
Figure 2B:
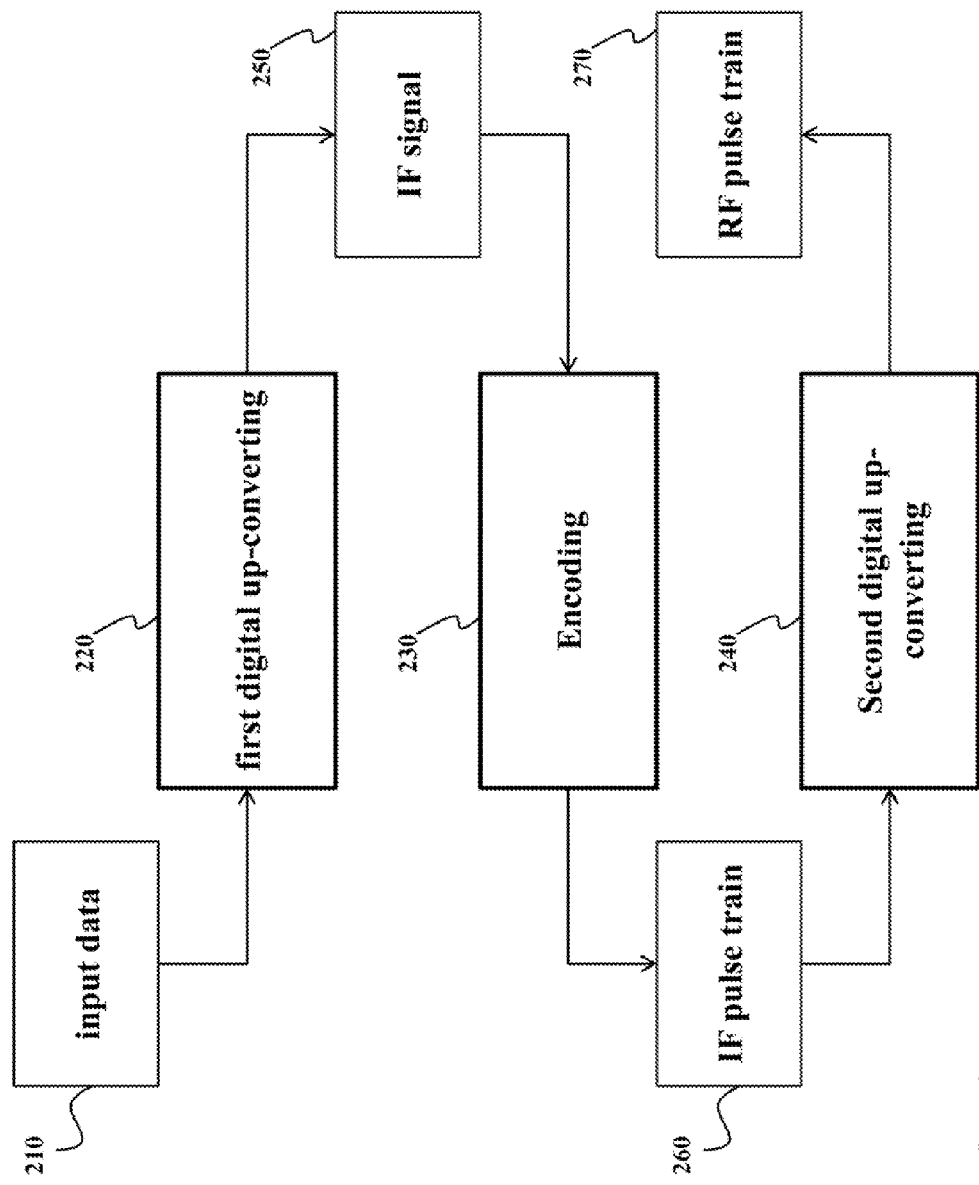
FIG. 2B is a block diagram of a method employed a power encoder of the transmitter of FIG. 2A according to some embodiments of the invention.

FIG. 2A is a block diagram of a direct digital-RF transmitter 200 according to some embodiments of the invention. FIG. 2B is a block diagram of a method employed a power encoder 21 of the transmitter 200 according to some embodiments of the invention. The steps of the method of the power encoder 21 can be implemented using a processor. For example, the power encoder can be realized as a digital logic integrated circuit, e.g., application-specific integrated circuit (ASIC).

The input data 210 can be provided to the power encoder by baseband for transmission. The output of the power encoder is a multi-level pulse train including analog information necessary to drive an amplifier 22. The power encoder 21 includes two digital frequency up-converters 25 and 27, and an intermediate frequency (IF) pulse-width-modulator 26. The first digital up-converter 25 converts 220 the input data 210 to IF signal 250. An IF pulse-width-modulator 26 encodes 230 the IF signal into an IF pulse train 260. The encoded result is further up-converted 240 to RF pulse train 270 by the second digital up-converter 27.

Some embodiments of the invention are based on a realization that decreasing the PWM input carrier from RF to IF frequency to better match the clock rate of conventional digital processors, and thus helps the efficient implementation of power coding. In various embodiments the IF is lower than RF and can depend on the clock rate of power encoders and/or amplifiers.

For example, the radio frequency (RF) is a rate of oscillation in the range of about 3 kHz to 300 GHz, which corresponds to the frequency of radio waves. In contrast, the intermediate frequency (IF) is a rate of oscillation in the MHz range, e.g., 100 MHz, which corresponds to the operational frequency of the clocks in various digital processors. The embodiments make the direct digital output to SMPA to become realizable. For example, in the Fourth Generation Long Term Evolution (4G LTE), a typical RF carrier frequency is in the band 1 (2100-MHz) and band 2 (1900-MHz). In the digital logic integrated circuit 21, the high rate clock (e.g., at a multiple of the carrier frequency $f_c$) is utilized during the digital signal processing of the input data for transmission (preferably in-phase (I) and quadrature (Q) signals). These are just exemplary numbers of the RF frequency. Depending on the countries and operators, different bands can be assigned, which is normally in the range of 600 Mhz-2.7 GHz, e.g. the frequency of $LO_{RFI}$ and $LO_{RFQ}$.

One embodiment also uses the power amplifier 22 for amplifying the RF pulse train. The power amplifier can be a switching power amplifier (such as class-S PA module) that receives a multi-level pulse train as an input, and amplifies the high-speed pulse signal. In addition, some embodiments use the reconstruction filter 23 and antenna 24. The reconstruction filter 23 can be a high quality factor (Q) bandpass filter for class-S PA. The reconstruction filter 23 filters the out of band noise, and restores the analog RF signal from the high speed pulse-train. Next, the analog RF signal is radiated in the air through an antenna 24.

Figure 2C:
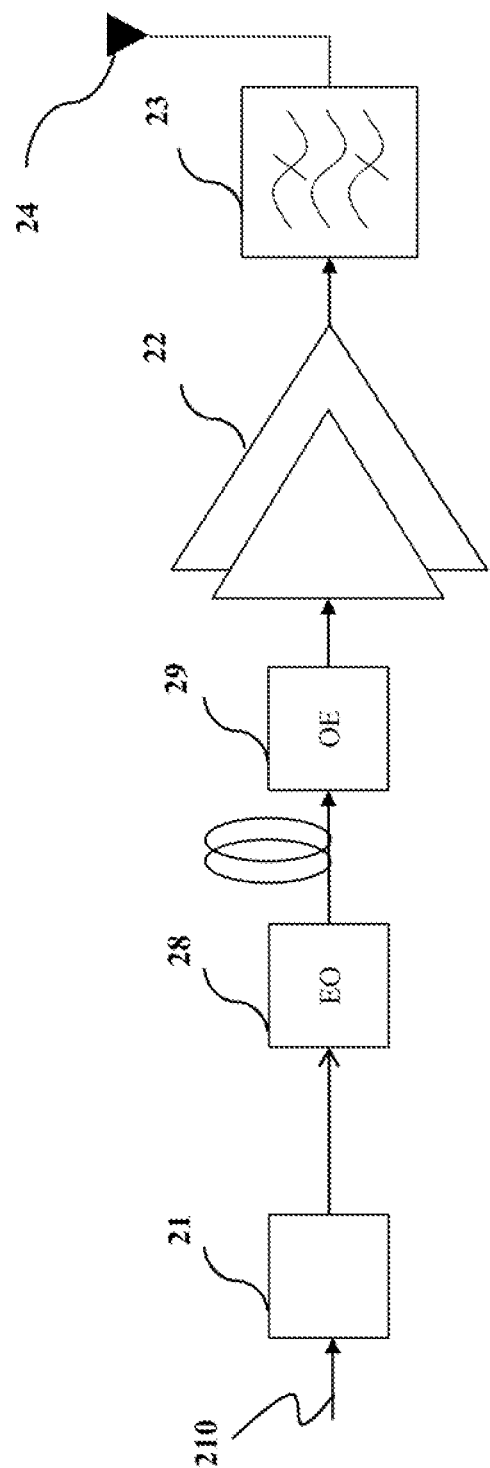
FIG. 2C is a block diagram of the direct digital-RF transmitter with electro-optical and optical-electro converters according to some embodiments of the invention.

FIG. 2C is a block diagram of the direct digital-RF transmitter with electro-optical and optical-electro converters for optical transmission of pulse width modulated signals to the switch mode power amplifier. In this embodiment, the output of the circuit 21 is converted from an electrical signal to an optical signal by an electro-optical converter 28 and transmitted via an optical connection to the input of the optical-electro converters 29. The pulse width modulated signals are optically transmitted to the switch mode power amplifier 22.

Figure 3:
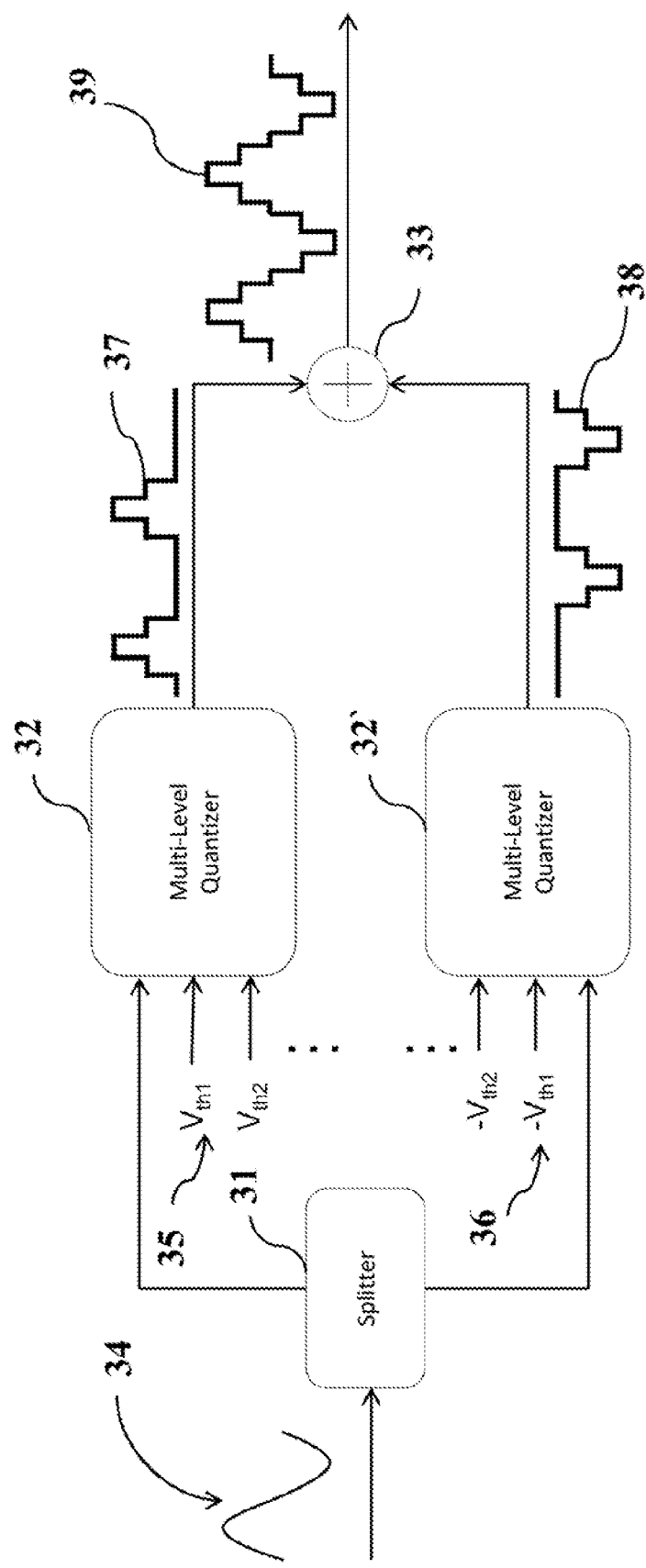
FIG. 3 is a block diagram of the multi-level pulse-width-modulator based on a set of fixed thresholds.

FIG. 3 shows a block diagram of the IF pulse-width-modulator (IFPWM) 26 according to one embodiment. In this embodiment, the IFPWM is multilevel PWM, e.g., 5-level PWM. The 5-level PWM waveform is generated exemplarily, using multi-level quantizer 32. In some implementations, the IFPWM includes a splitter 31, two multi-level quantizers, a first quantizer 32 and a second quantizer 32', and a combiner 33. The input 34 of the splitter 31 is the transmitted information with IF carrier frequency. The splitter 31 duplicates the signal, and the signals are submitted to the multi-level quantizers. Each multi-level quantizer performs the comparison with a set of thresholds, e.g., a first set 35 and a second set 36. The threshold values 36 of the lower quantizer 32' are opposite, i.e., have the same absolute values but different sign, to the threshold values 35 of the upper quantizer 32. The compared results are shown as the symmetric but delayed step waveforms 37 and 38. The two quantizers' output step waveforms 37 and 38 are added together by the combiner 33 to generate the complete multi-level pulse-width-modulation waveform 39, i.e., pulse train.

In contrast with the conventional PWM, which uses additional clocks to generate the triangular or sawtooth reference waveform, and then use analog comparator to output PWM, in some embodiments, the PWM is a multi-level PWM having a non-uniform multi-level quantizer with multiple fixed thresholds. For example, each fixed threshold can be determined based on a probability density function (PDF) of a portion of the input signal. In one embodiment, the set of fixed thresholds is determined adaptively based on transmitted frame or subframe.

Figure 4:
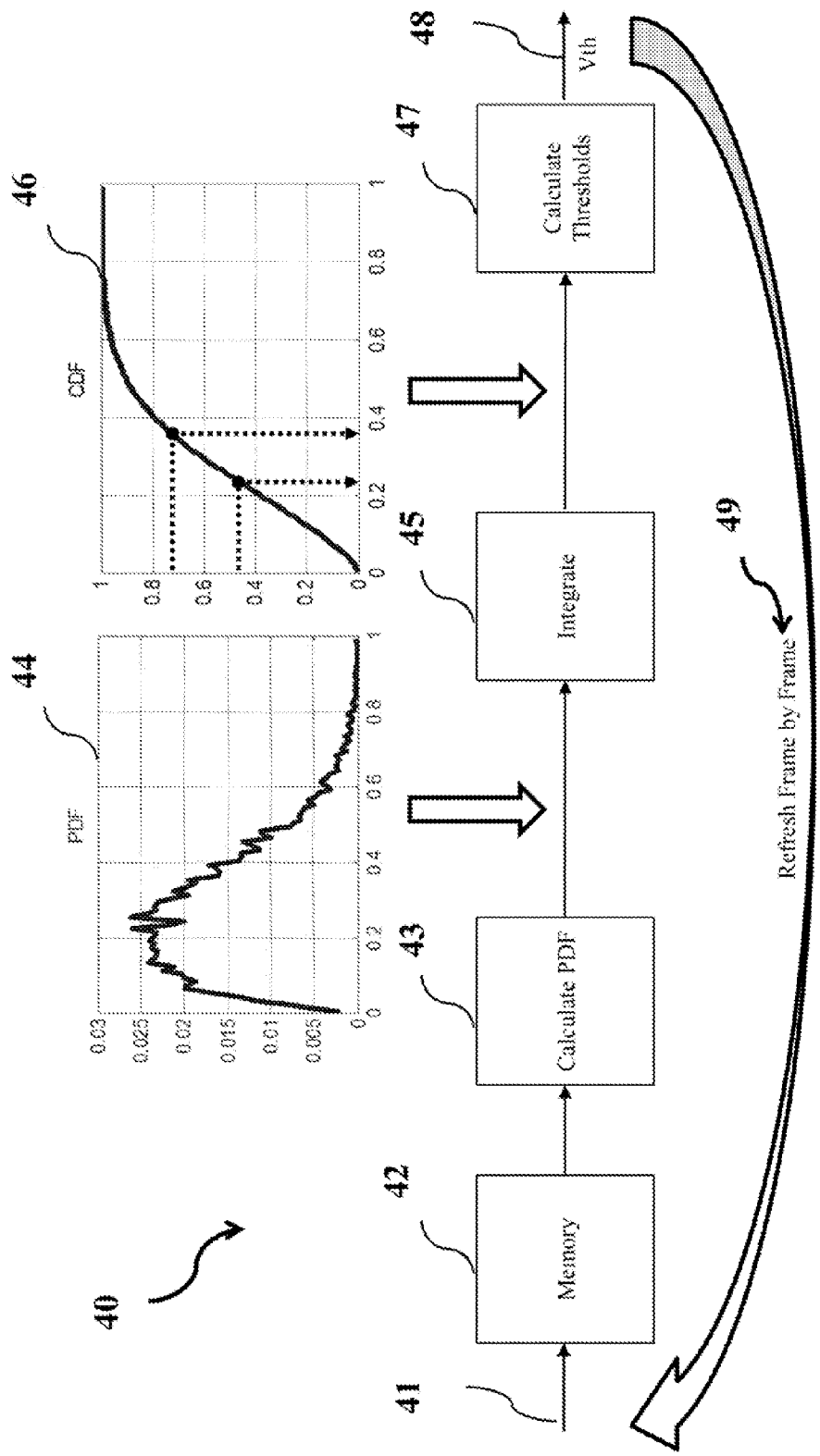
FIG. 4 is a schematic of determining the set of fixed thresholds according to some embodiments of the invention.

FIG. 4 shows a schematic of a method for determining the set of fixed thresholds, which is adaptive to each transmitted frame or subframe according to some embodiments of the invention. The method can be implemented by a processor 40 connected to a memory 42. The baseband input data 41 of a frame are stored in a memory 42 as vectors or arrays. Then, the processor 40 determines 43 the probability density function (PDF) 44 from data in the frame. The PDF is integrated 45 to generate a curve 46 of the cumulative distribution function (CDF). From the CDF curve 46, a set of threshold values 48 are selected, e.g., the CDF curve is equally spaced. This process is adaptively repeated 49 frame by frame to ensure the set of thresholds 48 is kept optimized.

Figure 5:
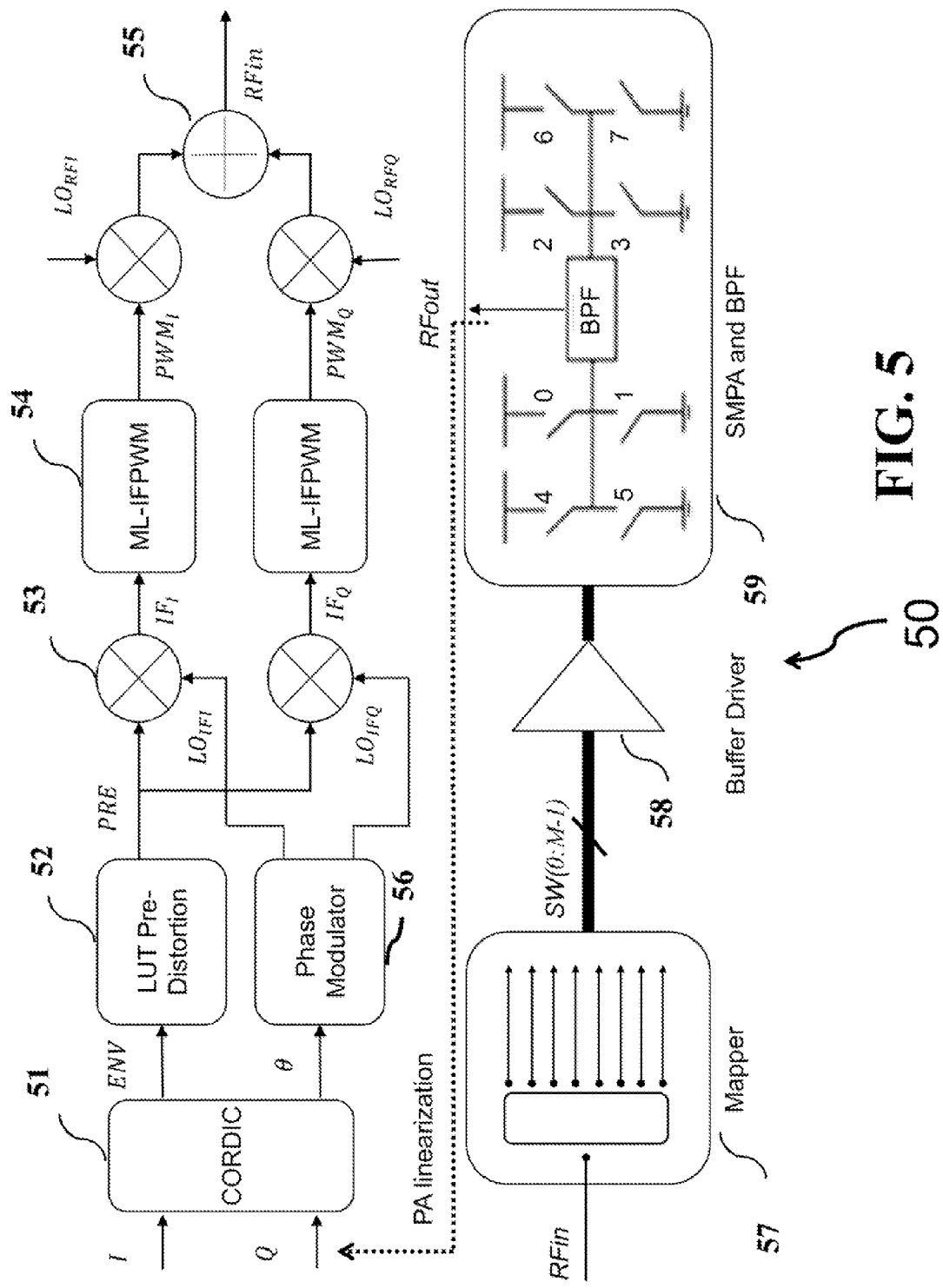
FIG. 5 is a block diagram of the direct digital-RF transmitter according to some embodiments of the invention.

FIG. 5 shows a block diagram of the direct digital-RF transmitter 50 according to some embodiments. In these embodiments, a pre-distortion block based on a look-up table (LUT) is arranged before the encoder to further compensate the linearity. After the encoder, a 4-phase LO is employed to up-convert the IF IQ signal into RF band. Hence, this embodiment is a two-stage digital up-conversion at a reduced sampling rate. Because this is a pipeline architecture, the embodiments can use a parallel implementation to increase sampling rate for higher time domain quantization to achieve the desired linearity.

The input data are complex and includes both in-phase (I) and phase-quadrature (Q) paths. The complex input is processed by a coordinate rotation digital computer (CORDIC) block 51 to converter the Cartesian data into polar data (i.e., envelope (ENV) and phase θ). A LUT pre-distortion unit 52 is enabled to pre-distort the ENV for linearity correction of the nonlinear ML-IFPWM 54 power encoder. The output is noted as PRE. The phase modulator 56 generated the phase modulation (PM) IQ signal ($LO_{IFI}$ and $LO_{IFQ}$) at the IF carrier frequency (e.g., 100-MHz for LTE application). Two IF digital up-converters (DUCs) 53 mix the PRE with $LO_{IFI}$ and $LO_{IFQ}$, respectively.

The output of the IF DUCs 53 $IF_I$ and $IF_Q$ are encoded by two ML-IFPWM power encoders 54, e.g., shown in FIG. 3. The generated pulse trains are $PWM_I$ and $PWM_Q$. Another set of digital up-converters mix $PWM_I$ and $PWM_Q$ with $LO_{RFI}$ {1,0,−1,0, ...} and $LO_{RFQ}$ {0,1,0,−1, ...}, respectively. The products are added by the combiner 55 to output $RF_{in}$. (i.e., $RF_{in}=PWM_I \cdot LO_{RFI}+PWM_Q \cdot LO_{RFQ}$) and then a mapper 57 converts the multi-level RFin into the control bits signal.

Usually, a (2M−1)-level pulse train need M control bits, for instance, 2 bits for 3-level and 3 bits for 5-level IFPWM signal. The M control bits are binary switching signal SW(0: M−1) to control the switches (e.g., using GaN transistors) of the power amplifier (e.g., class-S PA) in 59. To fit the multi-bits input, the power amplifier can be configured in H-bridge for 3-level signal, or the paralleled H-bridge for 5-level signal.

There can be also a feedback from the output of the power amplifier. The feedback couples a small amount of power back to the input for characterizing the nonlinearity introduced by the power amplifier. Before the power amplifier, a buffer driver 58 is required to synchronize the multi-bits input and also provide some amplification to reach the power amplifier's input power requirement. Within 59, a bandpass reconstruction filter (BPF) can also be included in the SMPA module for filtering the out-of-band quantization noise in order to transmit the clean analog $RF_{out}$, and preferably the BPF can recycle power associated with those undesired spectral components back to the SMPA. The $RF_{out}$ suitable for transmission by an antenna. Other conventional transmitter and receiver components can also be used, e.g., an isolator to eliminate the effect of power reflections.

Figure 6:
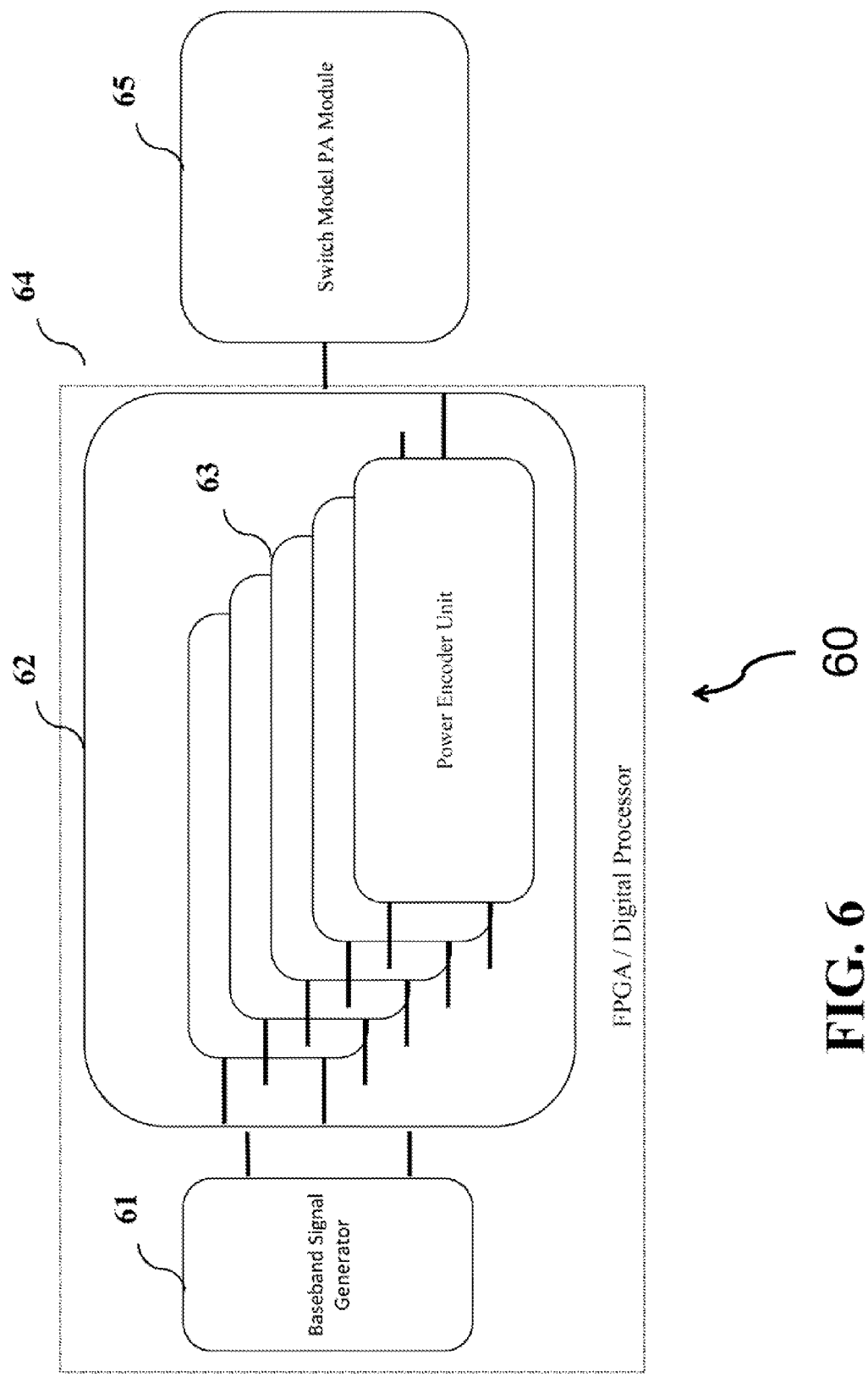
FIG. 6 is a block diagram of FPGA/digital processor implementation of the direct digital-RF transmitter according to an embodiment of the invention.

FIG. 6 shows an implementation of the direct digital-RF transmitter 60 according to one embodiment of the invention. The direct digital-RF transmitter 60 includes two parts, i.e., a digital part 64, and RF part 65. The digital part is discretely implemented by FPGA or digital processor with the increasing sampling clocks from the left to right. The baseband signal generator 61 provides the input data to the power coding encoder 62. The power encoder 62 processes the input data in parallel by each unit 63 in order to reach a high rate clock for the direct digital-RF transmitter 60. As mentioned above, the high rate clock is preferably at around a multiple (preferably 4 times) of the carrier frequency $f_c$, which could be in the band 1 (2100-MHz) or band 2 (1900-MHz) for LTE application in United States. For instance, assume that 125 MHz (1/64 sampling rate) is for each unit, which is the accessible clock rate and can be realized by a field programmable gate array (FPGA), and there are 64 units in parallel. After the parallel signal processing, the results are serialized to the switch model power amplifier module 65. The SMPA module's input sampling rate is 125·64=8000 MHz, which is 4 times $f_c$ (2000-MHz).

Figure 7:
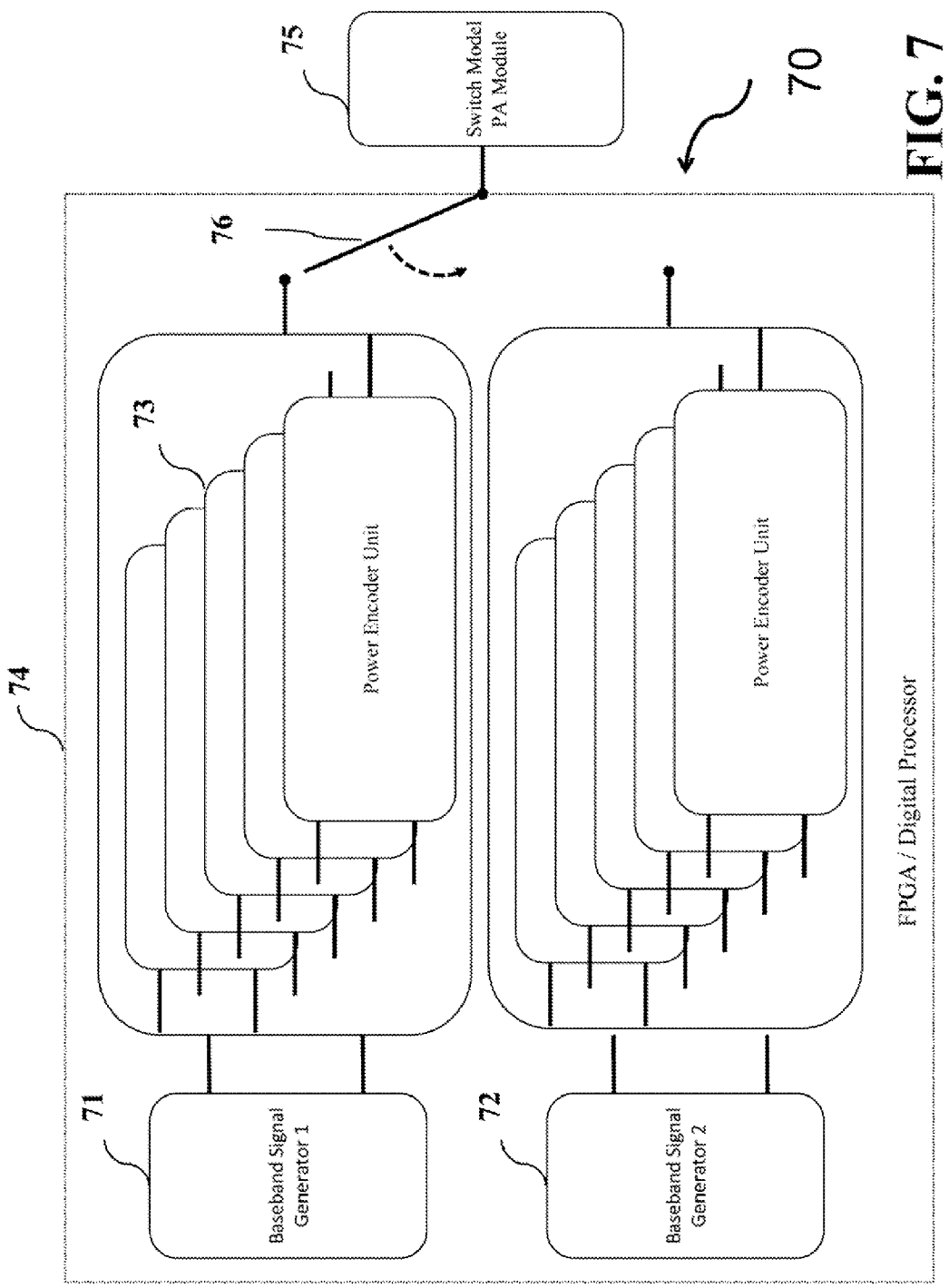
FIG. 7 is a block diagram of the implementation of the multi-mode multi-band direct digital-RF transmitter according to an embodiment of the invention.

FIG. 7 is a block diagram of the multi-mode multi-band direct digital-RF transmitter 70 according to another embodiment of the invention. Similar to the single mode implementation in FIG. 6, this embodiment has a digital part 74 implemented by a FPGA or a digital processor, and an RF part 75, e.g., SMPA or BPF. Two different baseband signal sources 71 and 72 at the different rates are encoded separately by the power encoder in parallel. The rate adaptor 76 combines two encoded ML-IFPWM signals locating at spaced RF carrier frequencies. This direct digital-RF transmitter architecture 70 is in dual-mode dual-band operation. The direct digital-RF transmitter 70 with more than dual-mode dual-band may also be used.

Simulation shows that around 75% power coding efficiency could be achieved for 5 MHz 9.95 dB PAPR LTE signal using 5-level IFPWM power encoder of some embodiments of this invention.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A transmitter, comprising:
    a first digital up-converter for converting data to an intermediate frequency (IF) signal;
    a pulse width modulator (PWM) for encoding the IF signal to an IF pulse train;
    a second digital up-converter for converting the IF pulse train to a radio frequency (RF) pulse train;
    a power amplifier for amplifying the RF pulse train; and
    a filter for reconstructing a RF analog signal from the amplified RF pulse train, and wherein the PWM is a multi-level PWM, further comprising:
    a splitter for duplicating the IF signal;
    two multi-level quantizers, each quantizer quantizes the IF signal based on the comparison of the IF signal with a set of thresholds to produce two waveforms; and
    a combiner for combining the two waveforms to produce the IF pulse train, and the two multi-level quantizers includes a first quantizer and a second quantizer, and the set of thresholds includes a first set of thresholds and a second set of threshold, and wherein values of the threshold in the first set are opposite to values of the threshold in the second set.

2. The transmitter of claim 1, further comprising:
an electro-optical converter for converting the RF pulse train into an optical signal; and
an optical-electro converters for converting the optical signal into an RF signal.

3. The transmitter of claim 1, wherein the PWM is a multi-level PWM modulating based on a set of fixed thresholds.

4. The transmitter of claim 1, wherein the PWM is a multi-level PWM having a non-uniform multi-level quantizer with multiple fixed thresholds.

5. The transmitter of claim 4, wherein each fixed threshold is based on a probability density function (PDF) of a portion of the input signal.

6. The transmitter of claim 5, further comprising:
a memory for storing a frame of the data;
a processor for determining the PDF from data in the frame, for integrating the PDF to generate a curve of a cumulative distribution function (CDF), and for selecting values of each fixed threshold based on the curve.

7. The transmitter of claim 6, wherein the processor determines the set of fixed threshold for each frame of the data.

8. The transmitter of claim 1, wherein the PWM is a nonlinear multi-level PWM (ML-IFPWM), further comprising:
a pre-distortion unit for pre-distorting at least part of the data for linearity correction of the nonlinear ML-IFPWM.

9. The transmitter of claim 1, wherein the first digital up-converter, the PWM, and the second digital up-converter form a power encoder unit, further comprising:
a plurality of power encoder units arranged in parallel for processing the data.

10. The transmitter of claim 1, wherein the plurality of power encoder units forms a power encoder, further comprising:
a plurality power encoders arranged in parallel, each power encoder operating at a different sampling rate;
a plurality of baseband signal sources connected to a corresponding power encoder; and
a rate adaptor for combining outputs of the plurality power encoders.

* * * * *